United States Patent
Yang et al.

(10) Patent No.: US 9,689,057 B2
(45) Date of Patent: Jun. 27, 2017

(54) STEEL SHEET COATED WITH ALUMINUM-MAGNESIUM

(71) Applicants: POSCO, Pohang-si, Gyeongsangbuk-do (KR); RESEARCH INSTITUTE OF INDUSTRIAL SCIENCE & TECHNOLOGY, Pohang-si, Gyeongsangbuk-do (KR)

(72) Inventors: Ji Hoon Yang, Pohang-si (KR); Jae In Jeong, Pohang-si (KR); Tae-Yeob Kim, Pohang-si (KR); Yonghwa Jung, Pohang-si (KR)

(73) Assignees: POSCO, Pohang-si, Gyeongsangbuk-Do (KR); RESEARCH INSTITUTE OF INDUSTRIAL SCIENCE & TECHNOLOGY, Pohang-si, Gyeongsangbuk-Do (KR)

( * ) Notice: Subject to any disclaimer, the term of this patent is extended or adjusted under 35 U.S.C. 154(b) by 0 days.

(21) Appl. No.: 14/758,192

(22) PCT Filed: Dec. 24, 2013

(86) PCT No.: PCT/KR2013/012116
§ 371 (c)(1),
(2) Date: Jun. 26, 2015

(87) PCT Pub. No.: WO2014/104717
PCT Pub. Date: Jul. 3, 2014

(65) Prior Publication Data
US 2016/0194737 A1    Jul. 7, 2016

(30) Foreign Application Priority Data

Dec. 26, 2012 (KR) .................. 10-2012-0153882
Dec. 24, 2013 (KR) .................. 10-2013-0162033

(51) Int. Cl.
C22C 21/06 (2006.01)
C22C 38/00 (2006.01)
(Continued)

(52) U.S. Cl.
CPC .............. C22C 21/06 (2013.01); C22C 21/00 (2013.01); C22C 38/002 (2013.01); C22C 38/04 (2013.01);
(Continued)

(58) Field of Classification Search
CPC ... C23C 14/16; C23C 14/025; C23C 14/5806; C23C 14/024; C23C 14/5893;
(Continued)

(56) References Cited

U.S. PATENT DOCUMENTS 7,468,123 B2    12/2008    Heller et al.
2012/0295130 A1    11/2012    Nose et al.

FOREIGN PATENT DOCUMENTS

EP    2253410 A1    11/2010
JP    2000-282158 A    10/2000
(Continued)

OTHER PUBLICATIONS

Machine Translation, Tokuda et al., JP 2009-091652, Apr. 2009.*
(Continued)

*Primary Examiner* — Michael E La Villa
(74) *Attorney, Agent, or Firm* — McDermott Will & Emery LLP

(57) ABSTRACT

The present invention relates to an aluminum-magnesium coated steel plate using vacuum coating, wherein an aluminum-magnesium coating layer is constituted by 1 to 45 wt % of magnesium, a balance of aluminum, and other inevitable (Continued)

impurities, and an $Al_3Mg_2$ alloy phase is formed in the aluminum-magnesium coating layer by performing heat treatment of the steel plate.

8 Claims, 9 Drawing Sheets

(51) Int. Cl.
| | | |
|---|---|---|
| C22C 38/04 | (2006.01) | |
| C23C 14/35 | (2006.01) | |
| C23C 28/02 | (2006.01) | |
| C23C 10/28 | (2006.01) | |
| C23C 14/16 | (2006.01) | |
| B32B 15/18 | (2006.01) | |
| C23C 14/02 | (2006.01) | |
| C23C 14/58 | (2006.01) | |
| C23C 14/24 | (2006.01) | |
| C22C 21/00 | (2006.01) | |

(52) U.S. Cl.
CPC ............ *C23C 10/28* (2013.01); *C23C 14/025* (2013.01); *C23C 14/16* (2013.01); *C23C 14/165* (2013.01); *C23C 14/24* (2013.01); *C23C 14/35* (2013.01); *C23C 14/5806* (2013.01); *C23C 14/5893* (2013.01); *C23C 28/021* (2013.01); *Y10T 428/1275* (2015.01); *Y10T 428/12729* (2015.01); *Y10T 428/12736* (2015.01); *Y10T 428/12757* (2015.01); *Y10T 428/12764* (2015.01); *Y10T 428/12958* (2015.01); *Y10T 428/12972* (2015.01); *Y10T 428/12979* (2015.01); *Y10T 428/2495* (2015.01); *Y10T 428/24942* (2015.01); *Y10T 428/24967* (2015.01); *Y10T 428/26* (2015.01); *Y10T 428/264* (2015.01); *Y10T 428/265* (2015.01)

(58) Field of Classification Search
CPC ..... C23C 28/021; C23C 14/165; C23C 14/35; C23C 28/02; C23C 30/00; C23C 30/005; C23C 14/24; C23C 10/28; C23C 14/34; C22C 21/06; C22C 21/00; C22C 38/002; C22C 38/04; C22C 38/06; Y10T 428/12736; Y10T 428/1275; Y10T 428/12757; Y10T 428/12764; Y10T 428/12958; Y10T 428/12972; Y10T 428/12979; Y10T 428/12729; Y10T 428/265; Y10T 428/26; Y10T 428/264; Y10T 428/2495; Y10T 428/24967; Y10T 428/24942

See application file for complete search history.

(56) References Cited

FOREIGN PATENT DOCUMENTS

| | | |
|---|---|---|
| JP | 2005-537393 A | 12/2005 |
| JP | 2008-518100 A | 5/2008 |
| JP | 2009-091652 A | 4/2009 |
| JP | 2009-537699 A | 10/2009 |
| KR | 10-2006-0086932 A | 8/2006 |
| KR | 10-0711488 B1 | 4/2007 |
| KR | 10-2012-0128648 A | 11/2012 |
| WO | 2012/091345 A2 | 7/2012 |

OTHER PUBLICATIONS

International Search Report issued in corresponding International Patent Application No. PCT/KR2013/012116, mailed on Apr. 1, 2014; 4 pages with English translation.
Supplementary European Search Report EP Application No. 13868502.9 dated Dec. 23, 2015.

\* cited by examiner

STEEL SHEET COATED WITH ALUMINUM-MAGNESIUM

RELATED APPLICATIONS

This application is the U.S. National Phase under 35 U.S.C. §371 of International Patent Application No. PCT/KR2013/012116, filed on Dec. 24, 2013, which in turn claims the benefit of Korean Patent Application No. 10-2012-0153882 filed on Dec. 26, 2012 and Korean Patent Application No. 10-2013-0162033 filed on Dec. 24, 2013, the disclosures of which Applications are incorporated by reference herein.

TECHNICAL FIELD

The present invention relates to an aluminum-magnesium coated steel plate and a method of manufacturing the steel plate, and more particularly, to a steel plate having an aluminum-magnesium coating layer in order to prevent corrosion of the steel plate, and a method of manufacturing the steel plate.

BACKGROUND ART

Steel is a material having excellent physical properties for use in various industrial fields such as for vehicles, home appliances, and buildings. However, since steel reacts with oxygen and the like to easily cause corrosion, in order to prevent corrosion, surface treatment such as coating with a protective film is essentially required.

Steel is processed into various types such as a plate, a rod, and a tube, and among the types, a thin plate type of steel plate is a type of steel product most frequently used in the industrial fields. A method most frequently used to prevent corrosion of the steel plate is a method where a metal protective film having reactivity with oxygen which is higher than that of iron is applied on a surface of the steel plate to serve as a sacrificial anode and thus delay corrosion of the steel plate.

Representative metals of metals used when the steel plate is coated are zinc and aluminum, and examples of a method used to apply the metals on the steel plate include hot dipping, electroplating, and the like. A plating method is currently used in most steel plate surface treatment processes because a process thereof is easy and cost is low.

In the case where the steel plate is coated by using a zinc plating method, in order to improve corrosion resistance of the steel plate, a method of increasing a plating amount of zinc may be considered. However, a method of reducing a plating speed is used to increase the plating amount of zinc, but this method has a problem in that productivity is reduced.

Further, an increase in a plating amount of zinc is essentially accompanied by an increase in weight of the plated steel plate, which leads to a reduction in fuel consumption efficiency due to the increase in weight in the case of transporting machines. Moreover, currently, since natural resources of zinc are rapidly diminishing, it is urgent to discover a material capable of replacing zinc.

As a part of the aforementioned attempt, a method where a plating amount of zinc is not increased but heteroatoms are added to improve corrosion resistance of an existing zinc plated steel plate has been developed. Examples of the heteroatoms may include aluminum, magnesium, and the like.

The above information disclosed in this Background section is only for enhancement of understanding of the background of the invention and therefore it may contain information that does not form the prior art that is already known in this country to a person of ordinary skill in the art.

DISCLOSURE

Technical Problem

The present invention has been made in an effort to provide an aluminum-magnesium coated steel plate having a thickness that is smaller than that of a zinc plating layer of an existing zinc plating steel plate and yet exhibiting the same or higher performance by replacing zinc that is a metal used to prevent corrosion of the steel plate by aluminum-magnesium, and a method of manufacturing the steel plate. Since aluminum and magnesium may be used as a sacrificial anode, a protective film having excellent corrosion resistance may be implemented by appropriately adjusting aluminum-magnesium compositions.

Technical Solution

An exemplary embodiment of the present invention provides a steel plate having an aluminum-magnesium alloy layer, including: i) a steel plate; ii) an aluminum-iron alloy layer formed on an upper portion of the steel plate; and iii) the aluminum-magnesium alloy layer formed on an upper portion of the aluminum-iron alloy layer, in which the aluminum-magnesium alloy layer includes 1 to 45 wt % of magnesium based on an entire alloy layer. In this case, it is preferable that the aluminum-magnesium alloy layer include 9 to 45 wt % of magnesium based on the entire alloy layer.

It is preferable that the aluminum-iron alloy layer be formed in a thickness that is 1 to 50% of a thickness of the entire alloy layer in a direction of the alloy layer in the steel plate.

It is also preferable that in the aluminum-iron alloy layer, an iron component of the steel plate be diffused into a coating layer to form an $Al_xFe_y$ layer, and that the $Al_xFe_y$ layer satisfies the following conditions.

In the $Al_xFe_y$ layer, x is 1 to 3 and y is 0.5 to 1.5.

Further, it is preferable that a thickness of the aluminum-iron alloy layer is 0.2 to 1 μm.

Further, it is preferable that the aluminum-magnesium alloy layer is formed in a crystal phase where an α phase and a β phase ($Al_3Mg_2$) are mixed, and it is preferable that the aluminum-magnesium alloy layer is formed in a crystal grain form.

Further, it is preferable that a thickness of the aluminum-magnesium alloy layer is 0.5 to 30 μm.

In addition, it is preferable that crystal grains of the aluminum-magnesium alloy layer may be formed by an α phase and a β phase ($Al_3Mg_2$), and that an average grain diameter of the crystal grains is 0.1 to 2 μm.

Further, it is preferable that in the aluminum-magnesium alloy layer, an area ratio of the β phase/α phase of the crystal grain may be 10 to 70%.

In addition, it is preferable that an XRD intensity ratio Iβ (880)/Iα (111) of the α phase and the β phase of the aluminum-magnesium alloy layer may be 0.01 to 1.5.

Another exemplary embodiment of the present invention provides a method of forming an aluminum-magnesium alloy layer on a steel plate, including: i) preparing the steel plate; ii) vacuum depositing an aluminum coating layer on an upper portion of the steel plate; iii) vacuum depositing a magnesium coating layer on an upper portion of the aluminum coating layer at least one time or more; and iv) vacuum depositing a secondary aluminum coating layer on an upper portion of the magnesium coating layer at least one time or more.

Herein, the method further includes vacuum depositing a secondary magnesium layer on an upper portion of the secondary aluminum layer at least one time or more.

In addition, it is preferable that the magnesium coating layer instead of the aluminum coating layer is first vacuum deposited on the upper portion of the steel plate, and that continuously, the aluminum coating layer and the magnesium coating layer are sequentially vacuum deposited repeatedly at least one time or more.

Further, it is preferable that the magnesium coating layer that is vacuum deposited on the steel plate is reacted with iron on the steel plate by diffusion of aluminum that is vacuum deposited on the upper portion of magnesium to be vacuum deposited in a thickness in which an iron-aluminum alloy layer is formed on the coating layer.

Herein, it is preferable for the aluminum-magnesium alloy layer to include 1 to 45 wt % of magnesium based on an entire alloy layer, and it is more preferable for the aluminum-magnesium alloy layer to include 9 to 45 wt % of magnesium based on the entire alloy layer.

As described above, it is preferable for a thickness of an aluminum-magnesium coating layer formed of the aluminum coating layer and the magnesium coating layer to be 0.5 to 30 μm.

In this case, it is preferable for the coating layer to be vacuum deposited by magnetron sputtering.

In addition, it is preferable for the coating layer to be vacuum deposited by repeatedly reciprocating the steel plate disposed on upper portions of an aluminum source and a magnesium source.

Further, it is preferable that in the coating layer, a composition of the aluminum-magnesium coating layer is changed by changing a current applied to the aluminum source and the magnesium source.

Yet another exemplary embodiment of the present invention provides a method in which the steel plate where the aluminum-magnesium coating layer is formed is subjected to heat treatment in a heat treatment furnace to perform phase transformation of the aluminum-magnesium coating layer into the aluminum-magnesium alloy layer.

Herein, it is preferable that the heat treatment is performed under an inert atmosphere and a temperature in a range of 350 to 450° C. for a heat treatment time of 2 to 10 minutes.

One or more of the iron-aluminum alloy layer or the aluminum-magnesium alloy layer is formed from the coating layer by the aforementioned heat treatment.

In addition, it is preferable that in the aluminum-iron alloy layer formed by the aforementioned heat treatment, an iron component of the steel plate is diffused into the coating layer to form an $Al_xFe_y$ layer and the $Al_xFe_y$ layer satisfies the following conditions.

In the $Al_xFe_y$ layer, x is 1 to 3 and y is 0.5 to 1.5.

Further, it is preferable for a thickness of the aluminum-iron alloy layer to be 0.2 to 1 μm.

In addition, in the aluminum-magnesium alloy layer, one or more of an α phase or a β phase ($Al_3Mg_2$) is formed by the heat treatment.

Advantageous Effects

A steel plate having an aluminum-magnesium coating layer according to the present invention may have a thickness that is smaller than that of a zinc plating layer of an existing zinc plating steel plate, and yet has the same or higher corrosion resistance.

An aluminum-magnesium composition of which corrosion resistance is relatively excellent was confirmed by variously changing the aluminum-magnesium composition to perform coating on the steel plate and evaluating a corrosion property.

Further, after the aluminum-magnesium coated steel plate was subjected to heat treatment, corrosion resistance was evaluated to compare corrosion resistances of the coated steel plate before and after heat treatment. A magnesium content at which a stable coating layer where a change in corrosion resistance of the aluminum-magnesium coated steel plate before and after heat treatment was not extreme was confirmed.

MODE FOR INVENTION

Advantages and features of the present invention and methods to achieve them will be elucidated from exemplary embodiments described below in detail with reference to the accompanying drawings.

However, as those skilled in the art would realize, the described embodiments may be modified in various different ways, all without departing from the spirit or scope of the present invention, and on the contrary, exemplary embodiments introduced herein are provided to make disclosed contents thorough and complete and sufficiently transfer the spirit of the present invention to those skilled in the art. Therefore, the present invention will be defined only by the scope of the appended claims.

Hereinafter, the present invention will be described in more detail with reference to the drawings.

Figure 1:
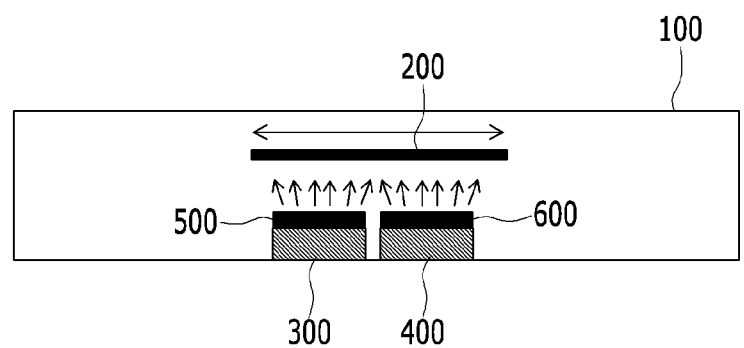
FIG. 1 illustrates vacuum coating equipment used in an exemplary embodiment according to the present invention.

FIG. 1 illustrates a schematic diagram of vacuum coating equipment used to apply aluminum-magnesium on a steel plate.

According to an exemplary embodiment of the present invention, in order to apply aluminum-magnesium on the steel plate, for example, a vacuum coating method may be used. In the vacuum coating method, as compared to an existing plating method, a process cost is high but a coating layer having a small thickness may be rapidly manufactured, and thus the vacuum coating method may have competitiveness in terms of productivity.

In FIG. 1, magnetron sputtering is used to form an aluminum-magnesium coating layer. Aluminum and magnesium sources are simultaneously operated, and a reciprocating motion or a rotation motion of a substrate is performed over a sputtering source to form the coating layer.

According to the exemplary embodiment of the present invention, as an aluminum-magnesium coating substrate, for example, a cold-rolled steel plate 200 may be used. Herein, the cold-rolled steel plate is preferably low carbon steel having a carbon content of 0.3 wt % or less, and is preferably used as a steel plate for vehicles, a steel plate for home appliances, or a steel plate for building materials.

Since the cold-rolled steel plate 200 is coated with a rust preventive oil, a degreasing process for removing rust preventive oil is required.

The degreasing process of the steel plate 200 may be performed by using, for example, a surfactant. After degreasing of the steel plate 200, ultrasonic wave washing is performed with, for example, alcohol and acetone, and the steel plate is then equipped in vacuum coating equipment.

Then, exhaustion is performed until a pressure in a vacuum vessel 100 is approximately $10^{-5}$ torr or less. After this vacuum exhaustion, argon gas may be injected into the vacuum vessel 100 to apply a DC voltage of about 800 V to the steel plate 200, when the degree of vacuum approaches $1*10^{-2}$ torr, and thus glow discharging is caused, thereby purifying a surface of a specimen.

When purification of the specimen is finished, the vacuum equipment is subjected to exhaustion until the pressure becomes approximately $10^{-5}$ torr that is a basic pressure, and aluminum-magnesium are then applied on the steel plate by using magnetron sputtering sources 300 and 400.

When aluminum and magnesium are applied on the steel plate by sputtering, aluminum and magnesium are sequentially applied. In this case, it is preferable that aluminum be first applied on the steel plate. However, magnesium may be first applied on the steel plate and aluminum may then be applied, but as long as a thickness of a magnesium coating layer may be controlled to be small by subsequent heat treatment or the like to react aluminum deposited on an upper portion of magnesium with iron on the steel plate by diffusion and thus form an iron-aluminum alloy layer on the steel plate, magnesium may be first applied on the steel plate and an aluminum layer may then be applied.

Further, when aluminum and magnesium are applied on the steel plate by sputtering, in the case where aluminum and magnesium are sequentially applied, a mode where after a magnesium layer is first applied on an upper portion of the aluminum layer, the magnesium layer is further applied, the aluminum layer is applied thereon, and the aluminum layer is further applied may be performed, that is, two magnesium layers and two aluminum layers may be sequentially applied on the upper portion of the aluminum layer.

As described above, in the case where the same material layers are repeatedly and sequentially applied on the same material layer (for example, application is performed in the order of Al—Mg—Mg—Al—Al—Mg), it is preferable that the substrate, that is, the steel plate 200, disposed on upper portions of the sputtering sources 300 and 400 of two materials, be repeatedly reciprocated.

In addition, it is preferable that a thickness of an aluminum-magnesium protective film applied on the steel plate 200 be 0.5 to 30 μm. Further, by changing a current applied to the aluminum and magnesium sputtering sources 300 and 400, evaporation ratios of aluminum and magnesium may be different from each other to change an aluminum-magnesium composition.

The aluminum-magnesium coating layer is formed on the steel plate 200 by the aforementioned sputtering method, and the aluminum-magnesium coating layer formed on the steel plate forms a multi-layered structure.

In this case, a content of magnesium in the aluminum-magnesium coating layer is preferably 1 to 45 wt %, and more preferably 9 to 40 wt %.

As described above, it is preferable that the steel plate where the aluminum-magnesium coating layer is formed be subjected to heat treatment in a vacuum heat treatment furnace.

As the vacuum heat treatment furnace, a heat treatment furnace formed by continuously connecting a preheating furnace, a heat treatment furnace, and a soaking pit may be used. In this case, it is preferable that in the preheating furnace, the heat treatment furnace, and the soaking pit, a blocking film blocking spaces of the furnaces at each connection portion and a door for moving the steel plate in the blocking film be formed.

After the heat treatment furnace is subjected to exhaustion into a vacuum state, an inert gas, for example, nitrogen gas, may be provided as an atmospheric gas.

In heat treatment of the steel plate where the aluminum-magnesium coating layer is formed, heat treatment is performed by first charging the steel plate into the preheating furnace, and then moving the steel plate to the heat treatment furnace in a state where a temperature is stabilized by heating the steel plate to a heat treatment temperature.

It is preferable that heat treatment of the steel plate where the coating layer is formed be performed at 350 to 450° C. for 2 to 10 minutes. If heat treatment is performed at 350° C. or less within 2 minutes, the aluminum-magnesium layer does not form the aluminum-magnesium alloy, and if heat treatment is performed at 450° C. or more for more than 10 minutes, an iron component of the steel plate is diffused into the coating layer or magnesium is diffused into the surface of the coating layer, and thus these are not preferable.

This heat treatment is preferably performed at 350° C. for 10 minutes or at 400° C. for 4 minutes.

If the steel plate where the coating layer is formed is subjected to heat treatment, the iron component of the steel plate is diffused into the coating layer at an interface between the steel plate and the coating layer to form an $Al_xFe_y$ layer, and a phase change of the aluminum-magnesium coating layer into the aluminum-magnesium alloy layer is performed.

Herein, in the $Al_xFe_y$ layer, it is preferable for x to be 1 to 3 and y to be 0.5 to 1.5, and it is preferable for a thickness of the $Al_xFe_y$ layer to be 0.2 to 1 μm.

In the $Al_xFe_y$ layer, since x and y values affect brittleness in an Al—Fe alloy phase by diffusion, the Al—Fe phase (e.g.: $Fe_3Al$, FeAl, and the like) improves adhesion force between the steel plate and the aluminum-magnesium alloy layer in a range where an alloy phase having poor mechanical properties (e.g.; $FeAl_2$, $Fe_2Al_5$, $FeAl_3$, and the like) is not generated, x is 1 to 3, and y is 0.5 to 1.5, and thus the x and y values are limited to the aforementioned range.

Further, the reason why a layer thickness of the Al—Fe alloy phase is limited to 0.2 to 1 µm is because if the thickness of the Al—Fe layer is increased, since a content of Al is relatively limited but a content of Fe is increased, the Al—Fe alloy phase having brittleness is generated, and thus mechanical properties of the coating layer may be reduced.

In this case, the $Al_xFe_y$ layer formed at an interface between the steel plate and the coating layer is an aluminum-iron alloy layer including magnesium in a small amount, and it is preferable for the $Al_xFe_y$ layer to be formed in a thickness that is 1 to 50% of a thickness of the aluminum-magnesium coating layer in a coating layer direction in the steel plate.

Herein, the reason why the thickness of the $Al_xFe_y$ layer is limited to 1 to 50% of the thickness of the coating layer is because if the $Al_xFe_y$ layer is formed in a thickness that is larger than 50% of the thickness of the coating layer, since the content of Fe is increased, the alloy phase having poor mechanical properties may be generated.

In addition, the aluminum-magnesium alloy layer subjected to the phase change by heat treatment is in a state where α and β phases are mixed. Herein, the α phase means an aluminum phase of a face-centered cubic lattice (FCC), and the β phase means $Al_3Mg_2$ of the face-centered cubic lattice. As described above, in the formed aluminum-magnesium alloy layer, a ratio of the α and β phases is an XRD intensity ratio, that is, Iβ (880)/Iα (111), and is preferably 0.01 to 1.5.

As described above, in the aluminum-magnesium alloy layer, the ratio of the α and β phases (Iβ/Iα) is set to 0.01 to 1.5 in order to limit the content of Mg at the β phase that is generated, because in the case where the Al—Mg coating layer is subjected to heat treatment, the XRD peak intensity of the generated Al—Mg alloy phase (β phase) is differently exhibited according to the content of Mg.

Further, in the aluminum-magnesium alloy layer subjected to the phase change by heat treatment, crystal grains are formed, and it is preferable that a size of the crystal grains be 0.2 to 1 µm.

Herein, the reason why the size of the crystal grains is limited to 0.2 to 1 µm is because in the case where the size of the crystal grains of the Al—Mg alloy layer is 0.2 µm or less, the size is not easy to obtain by controlling a heat treatment condition, and if the size is increased to 1 µm or more, division into the Al—Fe layer and the Mg layer occurs, and the division is not preferable.

In addition, it is preferable for the area ratio of the β phase/α phase of the crystal grains of the aluminum-magnesium alloy layer formed as described above to be 10 to 70%.

Herein, the reason why the area ratio of the β phase/α phase in the crystal grain of the aluminum-magnesium alloy is limited to 10 to 70% is because, in the case where the area ratio deviates from the aforementioned range, the Al—Mg alloy phase (R phase) is not formed, which is not preferable.

Example

First, as the specimen used in the experiment, a steel plate including 0.12 wt % or less of C (but 0% was excluded), 0.50 wt % or less of Mn (but 0% was excluded), 0.04 wt % or less of P (but 0% was excluded), 0.040 wt % or less of S (but 0% was excluded), the balance of Fe, and other inevitable impurities, and rolled to a thickness of 0.8 mm through hot rolling and cold rolling, was prepared.

In order to remove the rust preventive oil from the steel plate prepared as described above, degreasing was performed by using an olefin-based surfactant.

The steel plate subjected to degreasing was subjected to ultrasonic wave treatment with alcohol and then ultrasonic wave treatment with acetone to perform washing by ultrasonic waves, and then equipped in the vacuum coating equipment.

Next, after exhaustion was performed until the pressure in the vacuum vessel became $10^{-5}$ torr or less, the argon gas was injected into the vacuum vessel and the DC voltage of 800 V was applied to the steel plate when the degree of vacuum approached $1*10^{-2}$ torr, and thus glow discharging was caused, thereby purifying the surface of the specimen.

In addition, the steel plate where purification was finished was charged in the magnetron sputtering device where the aluminum source 300 and the magnesium source 400 were equipped, and exhaustion was performed until the pressure became $10^{-5}$ torr that was the basic pressure of the sputtering device.

Next, the magnetron sputtering device was operated to sequentially deposit aluminum and magnesium on the upper portion of the steel plate. In this case, the deposition amount was controlled by adjusting the voltage in the state where the aluminum source and the magnesium source were fixed, and the steel plate was repeatedly horizontally reciprocated to sequentially deposit aluminum-magnesium-magnesium-aluminum-aluminum-magnesium on the upper portion of the steel plate.

The deposition conditions of aluminum and magnesium deposited on the steel plate were the same as those of the following Table 1.

TABLE 1

| Deposition source | Al | Mg |
|---|---|---|
| Intensity of power supply | 0.6-8 Kw | 0.2-2.5 Kw |
| Process pressure | 10 mTorr (Ar 80 SCCM) | |
| Distance between steel plate and source | 70 mm | |

In the composition of the aluminum-magnesium coating layer deposited on the upper portion of the steel plate, the deposition ratio of the aluminum source (target) 500 and the magnesium source (target) 600 was controlled by controlling the intensity (kW) of the input power supply, and the composition of the aluminum-magnesium coating layer was controlled to 3.74 wt %, 5.69 wt %, 7.65 wt %, 12.25 wt %, 16.71 wt %, 20.97 wt %, 21.20 wt %, 27.72 wt %, and 31.50 wt % based on the content of magnesium in the entire coating layer. Further, the entire coating layer was deposited at a thickness of 5 µm.

As described above, after the aluminum-magnesium coating layer was deposited on the upper portion of the steel plate, each specimen was charged into the heat treatment furnace to perform heat treatment.

As the heat treatment furnace used for heat treatment of the coating layer, a vacuum heat treatment furnace where a preheating room and a heat treatment room were connected was used.

Heat treatment was performed by first charging the steel plate where the coating layer was formed into the preheating furnace, and then moving the steel plate to the heat treatment furnace in a state where the temperature was stabilized by heating the steel plate to the heat treatment temperature. In both the preheating furnace and the heat treatment furnace, the inert atmosphere was formed by the nitrogen gas, and the steel plate where the coating layer was formed was sufficiently preheated to the heat treatment temperature in the preheating furnace, and then moved to the heat treatment furnace.

In the heat treatment furnace, heat treatment of the steel plate where the coating layer was formed was performed at 350 to 450° C. for 2 to 10 minutes according to the composition of the coating layer while the heat treatment condition was changed.

That is, in the case where the heat treatment temperature was low, the heat treatment time was controlled to be slightly long, and in the case where the heat treatment temperature was high, the heat treatment time was controlled to be slightly short.

Figure 2:
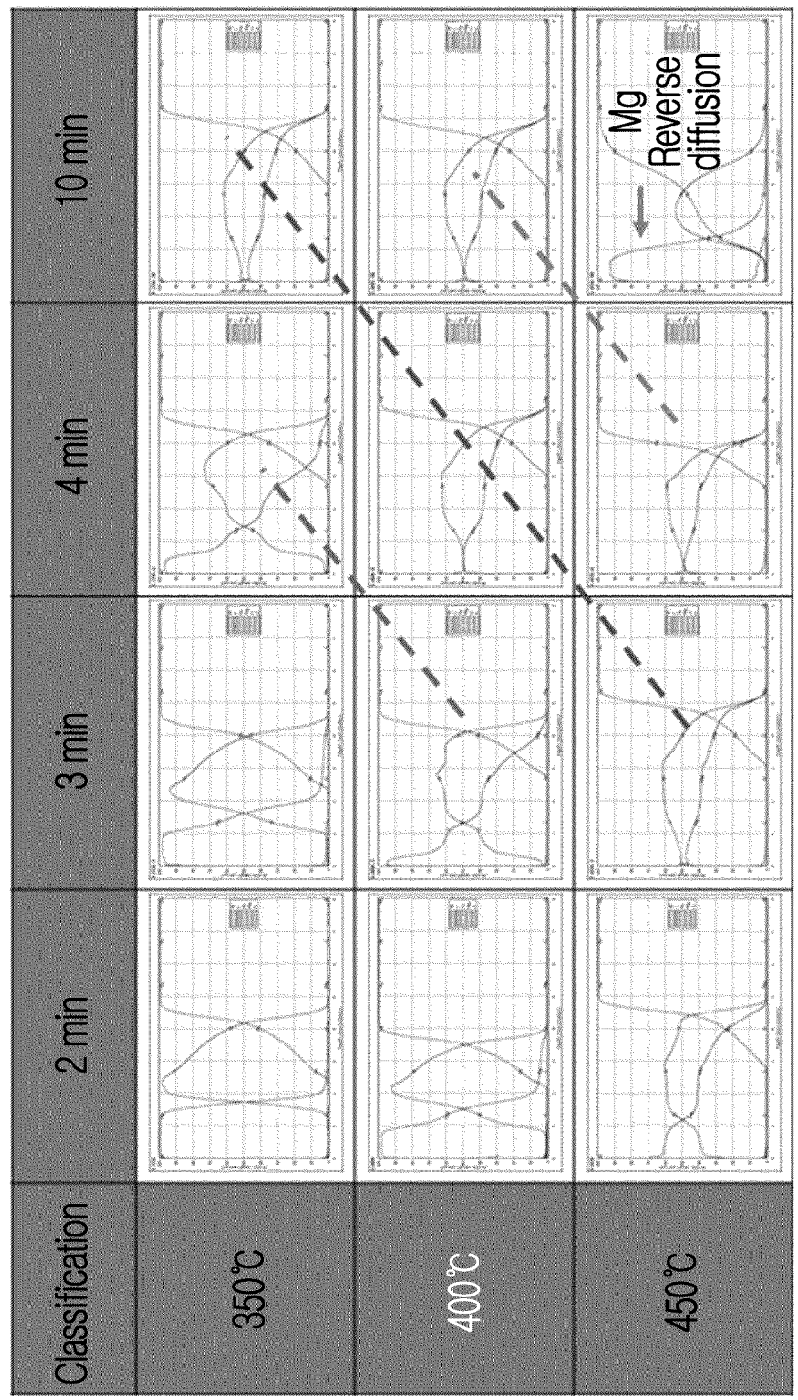
FIG. 2 is a graph illustrating a change of a coating layer according to a heat treatment temperature and a heat treatment time.

FIG. 2 illustrates a change of the coating layer according to the heat treatment temperature and the heat treatment time. In the specimen used in FIG. 2, the composition of magnesium of the coating layer was 39.0 wt %.

In addition, in each graph of FIG. 2, the red line (central line) of the left upper side represents a concentration change of aluminum, the blue line (leftmost line) of the left lower side represents a concentration change of magnesium, and the right green line represents a concentration change of iron.

As seen from FIG. 2, in the coating layer, the change according to diffusion of each component element exhibits the same effect for a short time as the temperature is increased. For example, it can be seen that in the case where heat treatment of the coating layer is performed at 350° C. for 2 minutes or more and performed at 450° C. for 10 minutes or less, the component elements of the coating layer are diffused into each other to form the aluminum-magnesium alloy layer.

However, it can be seen that in the case where heat treatment of the coating layer is performed at 350° C. for 2 minutes, since diffusion of the component elements is not sufficient, the aluminum-magnesium alloy is not well formed, and in the case where heat treatment is performed at 450° C. for 10 minutes, reverse diffusion of magnesium occurs.

Figure 3:
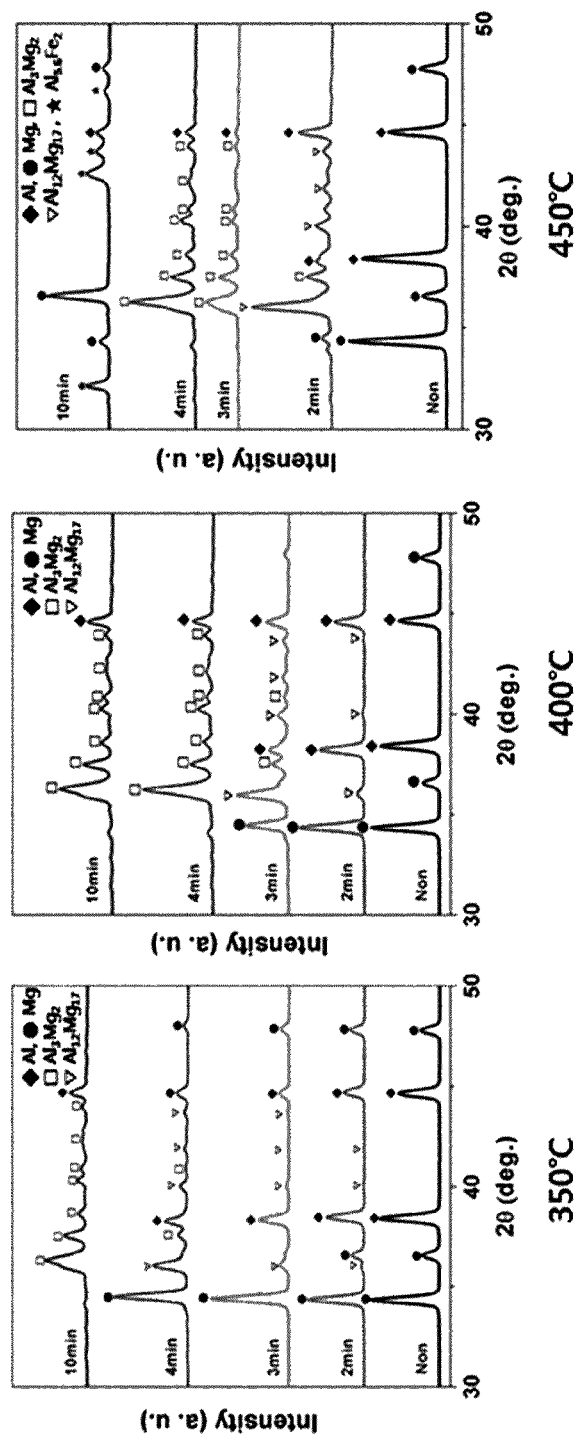
FIG. 3 illustrates an XRD (X-ray diffraction analysis) test result of a specimen used in FIG. 2.

FIG. 3 illustrates an XRD (X-ray diffraction analysis) test result of the specimen used in FIG. 2. In FIG. 3, a horizontal axis of each graph is an angle ($2\theta$) at which a peak is observed, a vertical axis represents the intensity, and a unit is represented by a normalized arbitrary unit (a.u.).

As seen from FIG. 3, in the case where the coating layer is subjected to heat treatment at 350° C. for 2 minutes or more, the aluminum-magnesium alloy layer (Mg or $Al_{12}Mg_{17}$) is formed, in the case where the coating layer is subjected to heat treatment at 450° C. for 10 minutes, the aluminum-iron alloy is formed at an interface of the steel plate, and under the temperature and the time condition therebetween, the $\alpha$ phase (Al) and the $\beta$ phase ($Al_3Mg_2$) are mixed while the aluminum-magnesium alloy layer is appropriately formed.

As described above, in the formed aluminum-magnesium alloy layer, the ratio of the $\alpha$ and $\beta$ phases was an XRD intensity ratio, that is, $I\beta$ (880)/$I\alpha$ (111), and was in the range of 0.01 to 1.5.

Figure 4:
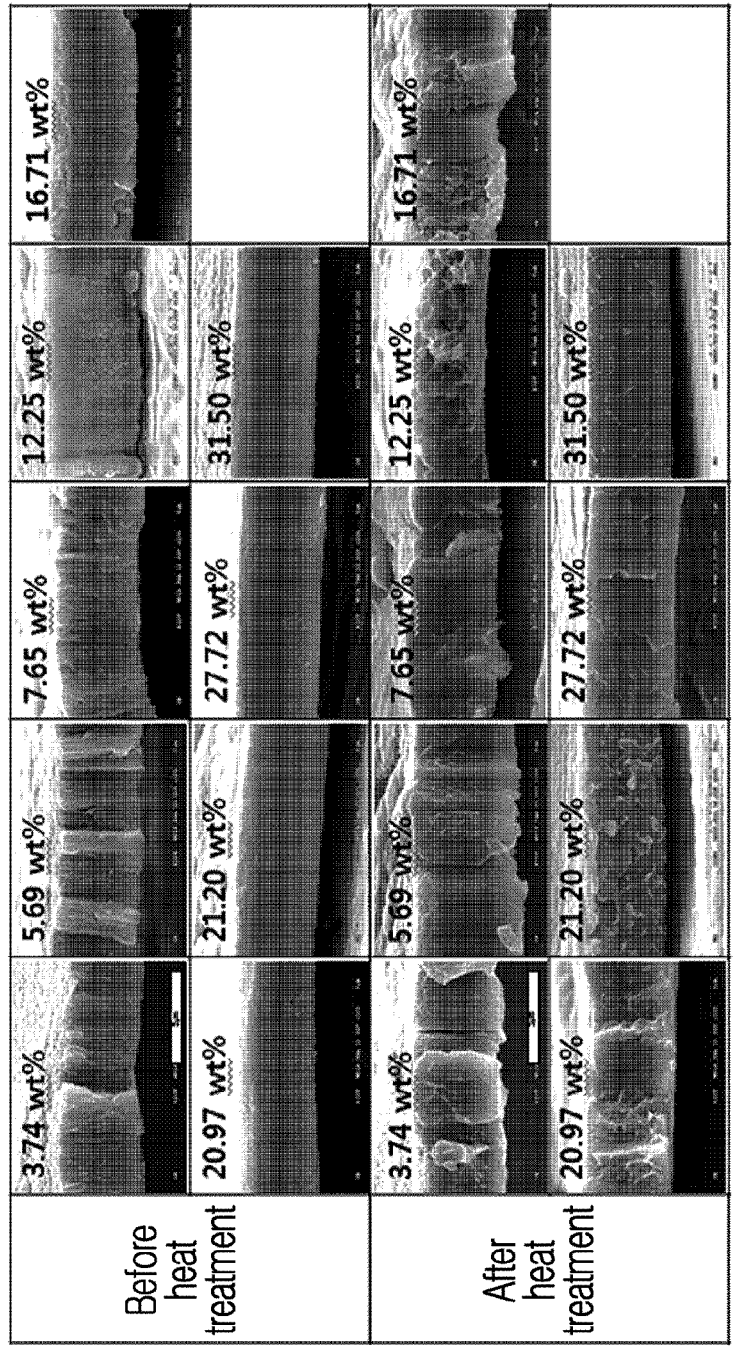
FIG. 4 is a scanning electron microscope (SEM) photograph illustrating a structure change of the specimen used in FIG. 2 according to heat treatment.

Next, FIG. 4 illustrates a scanning electron microscope (SEM) observation result of a structural change of the specimen used in FIG. 2 according to heat treatment.

As seen from FIG. 4, it could be observed that before the coating layer was subjected to heat treatment, in the aluminum-magnesium coating layer, the columnar structure was observed under the condition where the content of magnesium was 10 wt % or less and the state where the structure was dense was observed in the state where the content of magnesium was 10 wt % or more, but in the case where the coating layer was subjected to heat treatment, the crystal grains were formed while phase transformation of the coating layer into the aluminum-magnesium alloy layer was performed. In the aluminum-magnesium coating layer, the size of the crystal grains tended to be reduced if the content of magnesium was increased, and the size was in the range of 0.2 to 1 µm.

Figure 5:
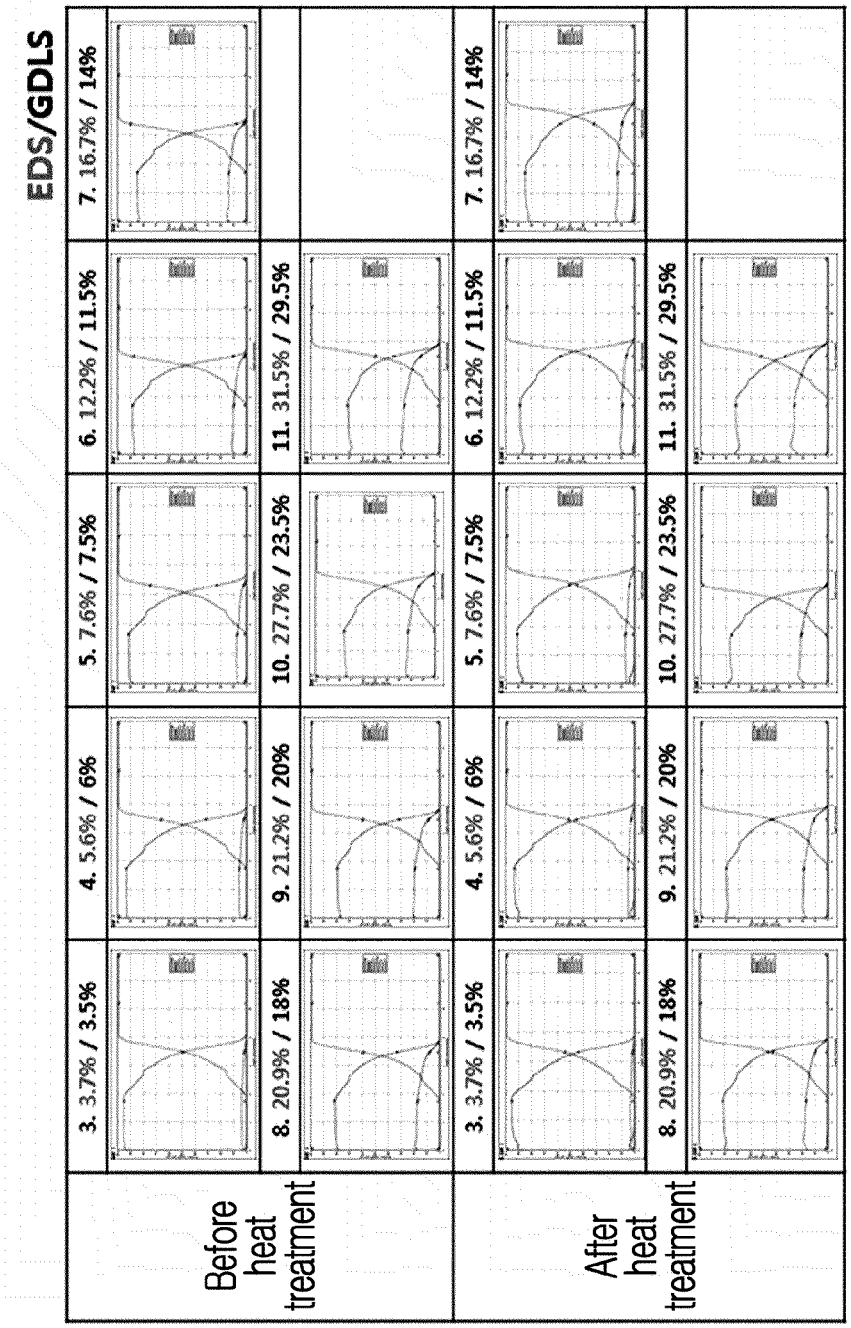
FIG. 5 illustrates a GDLS (glow discharge light spectroscopy) analysis result of the specimen used in FIG. 2 according to heat treatment.

Next, FIG. 5 illustrates a GDLS (glow discharge light spectroscopy) analysis result of the specimen used in FIG. 2 according to heat treatment.

As seen from FIG. 5, in the aluminum-magnesium coating layer, before and after heat treatment, in the steel plate, a composition change of the coating layer is not large in a direction of the coating layer (in each graph of FIG. 5, a direction from the left side to the right side), that is, a depth direction of the coating layer. This means that by heat treatment, $\alpha$ phase change of the coating layer occurs but the composition change is not large. That is, even though the phase change of the coating layer occurs by heat treatment, before and after the phase change occurs, the total amount of Al and Mg existing in the Al—Mg coating layer is not changed.

In the above, the observation result of the change of the coating layer of the steel plate where the aluminum-magnesium coating layer was formed according to heat treatment was described, and hereinafter, evaluation results of a corrosion experiment of the coating layer subjected to heat treatment and adhesion force of the coating layer will be described.

First, the corrosion experiment of the coating layer subjected to heat treatment will be described.

Figure 6:
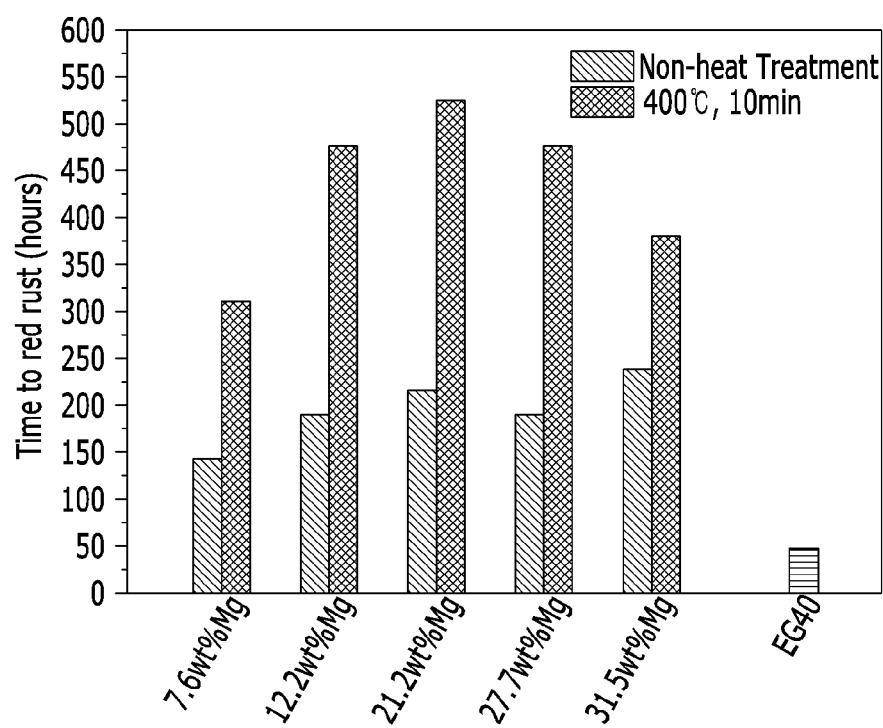
FIG. 6 is a graph illustrating a result of a neutral salt spray test performed in order to evaluate a corrosion characteristic of a steel plate where an aluminum-magnesium coating layer is formed with respect to the specimen partially taken from the specimen used in FIG. 2.

FIG. 6 illustrates a result of a neutral salt spray test performed in order to evaluate a corrosion characteristic of the steel plate where the aluminum-magnesium coating layer is formed with respect to the specimen partially taken from the specimen used in FIG. 2.

The neutral salt spray test was performed in 5% NaCl at 35° C. according to the ASTM B117 regulation. A horizontal axis of a graph of FIG. 6 represents the content of magnesium (the unit is wt %) of the coating layer, and a vertical axis represents a time (the unit is hours) at which red rust occurs.

In FIG. 6, a bar represented by diagonal lines represents a result of the specimen before heat treatment (non-heat treated), and a bar represented by crossed lines represents a result of the specimen subjected to heat treatment at 400° C. for 10 minutes. In addition, a bar represented by parallel lines represents a result of the neutral salt spray test of an electric zinc-plating steel plate having a thickness of 5.6 µm for comparison.

As described in FIG. 6, before heat treatment, in the steel plate where the aluminum-magnesium coating layer is formed, as the content of magnesium is increased, corrosion resistance tends to be slightly improved. However, in the steel plate where the aluminum-magnesium coating layer is formed was subjected to heat treatment at 400° C. for 10 minutes, the result where corrosion resistance was significantly improved in most ranges was exhibited.

As shown in FIG. 6, in the steel plate where the aluminum-magnesium coating layer was formed, corrosion resistance was significantly improved at the content of magnesium of 21.2 wt %, but at the content of 27 wt % or more, corrosion resistance was slightly reduced, but nevertheless, corrosion resistance was improved as compared to that of the specimen before heat treatment.

As described above, in the case where the steel plate where the aluminum-magnesium coating layer was formed was subjected to heat treatment, in the case where the content of magnesium of the coating layer was 7.6 to 31.5 wt %, excellent corrosion resistance was exhibited. This improvement of corrosion resistance is evaluated as a characteristic according to densification of the structure of the coating layer as the content of magnesium is increased and formation of the β phase ($Al_3Mg_2$) in the aluminum-magnesium alloy phase generated due to heat treatment. In this result of the neutral salt spray test, it can be confirmed that, as compared to the electric zinc-plating steel plate, performance is improved by about 10 times or more.

However, if the content of magnesium of the coating layer is increased to 45 wt % or more, the aluminum-magnesium coating layer became unstable, and corrosion resistance was reduced.

Figure 7:
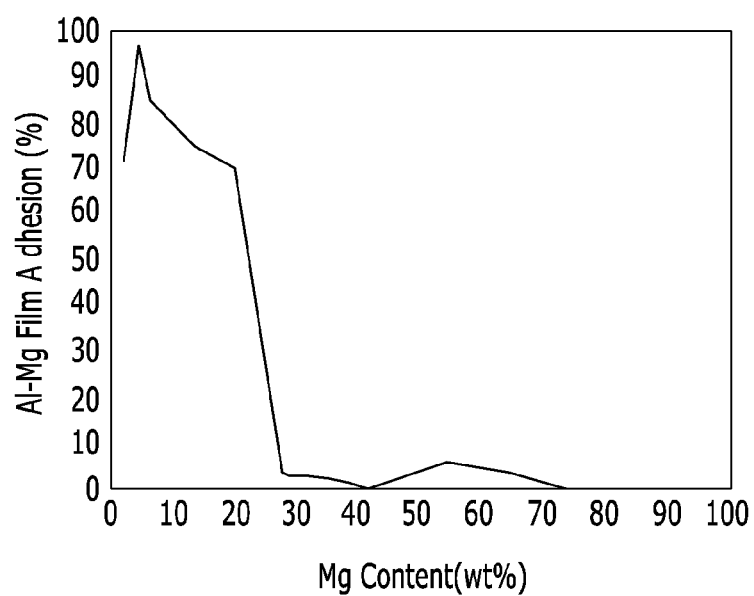
FIG. 7 is a graph illustrating an evaluation result of adhesion force of a steel plate of an aluminum-magnesium alloy layer.

FIG. 7 is a graph illustrating an evaluation result of adhesion force of the steel plate of the aluminum-magnesium alloy layer.

This adhesion force test was performed according to the ASTM D522 regulation.

As shown in FIG. 7, it can be seen that in the case where the content of magnesium of the coating layer is low, excellent adhesion force is exhibited, but as the content of magnesium of the coating layer is increased, adhesion force is reduced. As described above, the increase in adhesion force of the steel plate of the coating layer is evaluated to be caused by formation of the aluminum-iron alloy layer on the surface of the steel plate.

As described above, in order to observe the structure of the aluminum-magnesium alloy layer formed on the steel plate, the case where the specimen having the content of magnesium of 20.2 wt % of the coating layer was subjected to heat treatment at 400° C. for 10 minutes was checked by the transmission electron microscope (TEM).

Figure 8A:
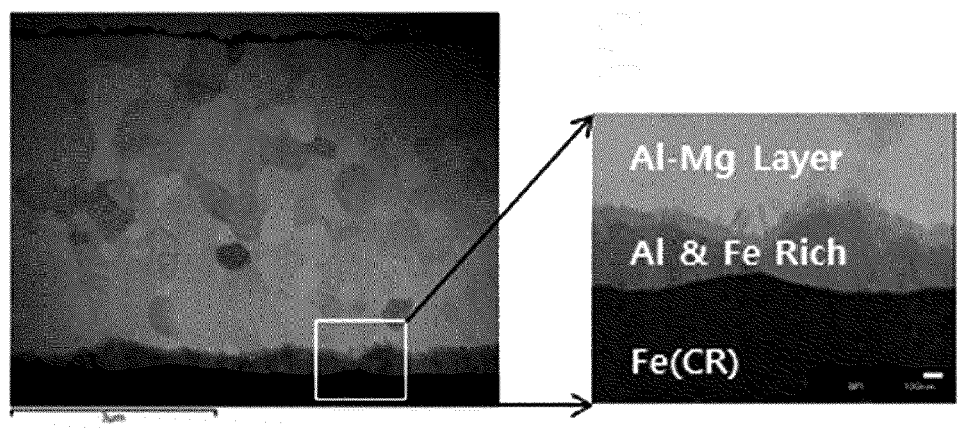
FIG. 8A is a transmission electron microscope (TEM) photograph illustrating a structure of the aluminum-magnesium alloy layer formed on the steel plate.
Figure 8B:
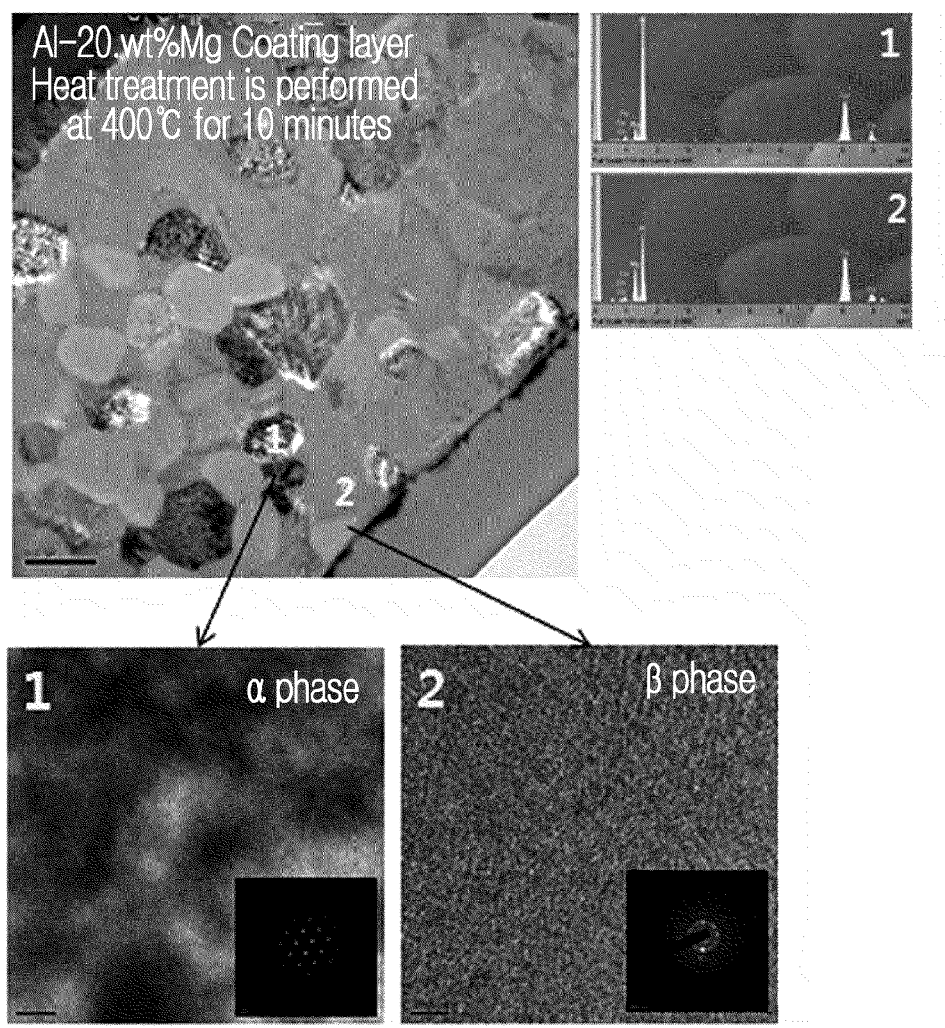
FIG. 8B is a partially enlarged transmission electron microscope (TEM) photograph of FIG. 8A.

FIGS. 8A and 8B illustrate this TEM result.

As seen from FIG. 8A, as the coating layer, the aluminum-iron alloy layer is formed by heat treatment between the steel plate and the aluminum-magnesium alloy layer. In addition, it can be seen that in the aluminum-magnesium alloy layer, the α phase and the β phase ($Al_3Mg_2$) are mixed while the crystal grains are formed.

Although the exemplary embodiments of the present invention have been described with reference to the accompanying drawings, it will be apparent to those skilled in the art that various modifications and changes may be made thereto without departing from the technical spirit or essential feature of the invention.

The invention claimed is:

1. A steel plate having an aluminum-magnesium alloy layer, comprising:
a steel plate;
an aluminum-iron alloy layer formed on an upper portion of the steel plate; and
the aluminum-magnesium alloy layer formed on an upper portion of the aluminum-iron alloy layer,
wherein the aluminum-magnesium alloy layer includes 1 to 45 wt. % of magnesium based on a total weight of the aluminum-magnesium alloy layer,
the aluminum-magnesium alloy layer is formed in a crystal grain form,
crystal grains of the aluminum-magnesium alloy layer are formed by an α phase and a β phase ($Al_3Mg_2$), and
an average grain diameter of the crystal grains is 0.1 to 2 μm.

2. The steel plate of claim 1, wherein, in the aluminum-magnesium alloy layer, an α phase and a β phase ($Al_3Mg_2$) are mixed.

3. The steel plate of claim 2, wherein the aluminum-iron alloy layer is formed in a thickness that is 1 to 50% of a thickness of an alloy layer including the aluminum-iron alloy layer and the aluminum-magnesium alloy layer in a direction normal to the surface of the aluminum-magnesium alloy layer.

4. The steel plate of claim 3, wherein, in the aluminum-iron alloy layer, an iron component of the steel plate is diffused into a coating layer to form an $Al_xFe_y$ layer, and the $Al_xFe_y$ layer satisfies the following conditions:
in the $Al_xFe_y$ layer, x is 1 to 3 and y is 0.5 to 1.5.

5. The steel plate of claim 4, wherein a thickness of the aluminum-iron alloy layer is 0.2 to 1 μm.

6. The steel plate of claim 1, wherein a thickness of the aluminum-magnesium alloy layer is 0.5 to 30 μm.

7. The steel plate of claim 1, wherein, in the aluminum-magnesium alloy layer, an area ratio of the β phase/α phase of the crystal grain is 10 to 70% in a horizontal cross-sectional plane of the aluminum-magnesium alloy layer.

8. The steel plate of claim 7, wherein an XRD intensity ratio Iβ (880)/Iα (111) of the α phase and the β phase of the aluminum-magnesium alloy layer is 0.01 to 1.5.

* * * * *